US007064558B1

(12) United States Patent
Bentley

(10) Patent No.: US 7,064,558 B1
(45) Date of Patent: Jun. 20, 2006

(54) MILLIVOLT OUTPUT CIRCUIT FOR USE WITH PROGRAMMABLE SENSOR COMPENSATION INTEGRATED CIRCUITS

(75) Inventor: Ian N. Bentley, New Ipswich, NH (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/015,924

(22) Filed: Dec. 16, 2004

(51) Int. Cl.
*G01R 27/28* (2006.01)
*G01R 27/02* (2006.01)

(52) U.S. Cl. ........................ 324/651; 324/610
(58) Field of Classification Search ............... 324/651, 324/650, 649, 600, 443, 526, 98, 207.19, 324/610, 648, 657, 666, 673, 680, 706, 725; 702/85, 104; 73/708, 726, 727, 514.33
See application file for complete search history.

(56) References Cited

U.S. PATENT DOCUMENTS

| 4,096,748 | A | | 6/1978 | Pichon | 374/172 |
|---|---|---|---|---|---|
| 4,595,884 | A | * | 6/1986 | Miller, Jr. | 330/258 |
| 4,766,763 | A | * | 8/1988 | Kurtz | 73/49.2 |
| 5,537,882 | A | * | 7/1996 | Ugai et al. | 73/727 |
| 5,604,684 | A | * | 2/1997 | Juntunen | 702/104 |
| 5,764,541 | A | * | 6/1998 | Hermann et al. | 702/98 |
| 5,796,298 | A | * | 8/1998 | Kearney et al. | 327/561 |
| 5,866,821 | A | * | 2/1999 | Raynes | 73/708 |
| 6,100,686 | A | | 8/2000 | Van Delden et al. | 324/252 |
| 6,323,662 | B1 | * | 11/2001 | Ferri | 324/725 |
| 2002/0171629 | A1 | * | 11/2002 | Archibald et al. | 345/157 |
| 2006/0052967 | A1 | * | 3/2006 | Champion et al. | 702/127 |

\* cited by examiner

*Primary Examiner*—Vincent Q. Nguyen
*Assistant Examiner*—Hoai-An D. Nguyen
(74) *Attorney, Agent, or Firm*—Kermit D. Lopez; Luis M. Ortiz

(57) ABSTRACT

An output sensor apparatus, system, and method including a circuit having a plurality of bridge resistors and one or more connecting resistors coupled to the plurality of bridge resistors. Additionally, a programmable amplifier can be coupled to the connecting resistor, wherein the circuit produces an output signal that changes in a manner similar to that of an output of a Wheatstone bridge circuit sensor. Thus, a circuit can be provided, which can be effortlessly added to a readily available programmable integrated circuit (IC) chip.

16 Claims, 2 Drawing Sheets

MILLIVOLT OUTPUT CIRCUIT FOR USE WITH PROGRAMMABLE SENSOR COMPENSATION INTEGRATED CIRCUITS

TECHNICAL FIELD

Embodiments are generally related to sensor methods and systems. Embodiments are also related to Wheatstone bridge circuits utilized in sensor applications. Embodiments are additionally related to programmable sensors and integrated circuits thereof.

BACKGROUND OF THE INVENTION

Wheatstone bridge circuits are utilizing in a variety of sensing applications, particularly those involving magneto-resistance, which is a phenomenon whereby the electrical resistance of a body can be influenced by magnetic flux. In such applications, the electrical resistance of the body changes in a predictable manner in response to a varying magnetic flux, making such a body suitable for use as a magnetic-electric transducer in a magnetic field sensor. However, as with any resistive body, the electrical resistance of such a body can also be influenced by other environmental factors, such as, for example, temperature. A problem in practical, but sensitive sensor applications involves configuring some means of differentiating between transducer signals resulting from varying magnetic flux and unwanted transducer signals emanating from other environmental sources. A popular approach is to include at least one magneto-resistive element in a Wheatstone bridge arrangement.

It is known to measure many physical parameters by using a Wheatstone bridge measuring circuit. Typically, the Wheatstone bridge measuring circuit includes two parallel branches, each of which includes two series arms. In one of the arms, parameter-responsive impedance, such as a temperature responsive resistor, can be connected. To determine the value of the variable impedance, and therefore the value of the parameter being monitored, the prior art bridges are generally adjusted to be in a balanced state, whereby a null voltage is developed across a diagonal of the bridge. The diagonal is between taps on the two branches. The bridge can be activated to a balanced condition either manually or automatically, by adjusting values of impedances, other than the monitoring impedance, of the bridge.

After balance has been achieved, the value of the variable parameter responsive impedance is calculated by using the well known balance equation. From the calculated value of the parameter responsive impedance, the value of the parameter is calculated from a known relationship between the parameter value and the impedance value of the parameter responsive impedance. These calculations can be performed either manually or automatically.

Thus, many sensors utilize a Wheatstone bridge circuit configuration, which is essentially a very simple circuit. Compensation of the sensor, however, requires the addition of resistances in series or parallel with the active components. Recently, programmable compensation integrated circuits (IC's) have been implemented, which allow digital compensation of the sensor circuitry. Due to the limitations of analog-to-digital and digital-to-analog converters, however, such configurations produce an amplified voltage output, which is typically in the range of 0.1 Volts to 4.9 Volts. Perfect rail-to-rail circuits, for example, are difficult to implement. Unfortunately, there are presently no IC's available, which can produce an output similar to that of an unamplified Wheatstone bridge circuit.

BRIEF SUMMARY

The following summary is provided to facilitate an understanding of some of the innovative features unique to the embodiments disclosed herein and is not intended to be a full description. A full appreciation of the various aspects of the embodiments can be gained by taking the entire specification, claims, drawings, and abstract as a whole.

It is, therefore, one aspect of the present invention to provide for improved sensor devices, methods, and systems.

It is another aspect of the present invention to provide for improved programmable sensors and integrated circuits thereof.

The aforementioned aspects of the invention and other objectives and advantages can now be achieved as described herein. An output sensor apparatus, system, and method are disclosed, including a circuit comprising a plurality of bridge resistors and one or more connecting resistors coupled to the plurality of bridge resistors. Additionally, a programmable amplifier can be coupled to the connecting resistor, wherein the circuit produces an output signal that changes in a manner similar to that of an output of a Wheatstone bridge circuit sensor. The programmable amplifier can produce a signal in a range of approximately 0 volts to 5 volts at approximately plus or minus 1 mA of current.

The bridge resistors can be configured to include four bridge resistors, including a first resistors coupled to a second resistor, a third resistor connected to the second resistor and a fourth resistor connected to the third resistor and the second resistor. The connecting resistor is generally connected to the first resistor and the fourth resistor of the bridge resistors.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the inventions serve to explain the principles of the present invention.

DETAILED DESCRIPTION

The particular values and configurations discussed in these non-limiting examples can be varied and are cited merely to illustrate at least one embodiment and are not intended to limit the scope of the claims disclosed herein.

Figure 1:
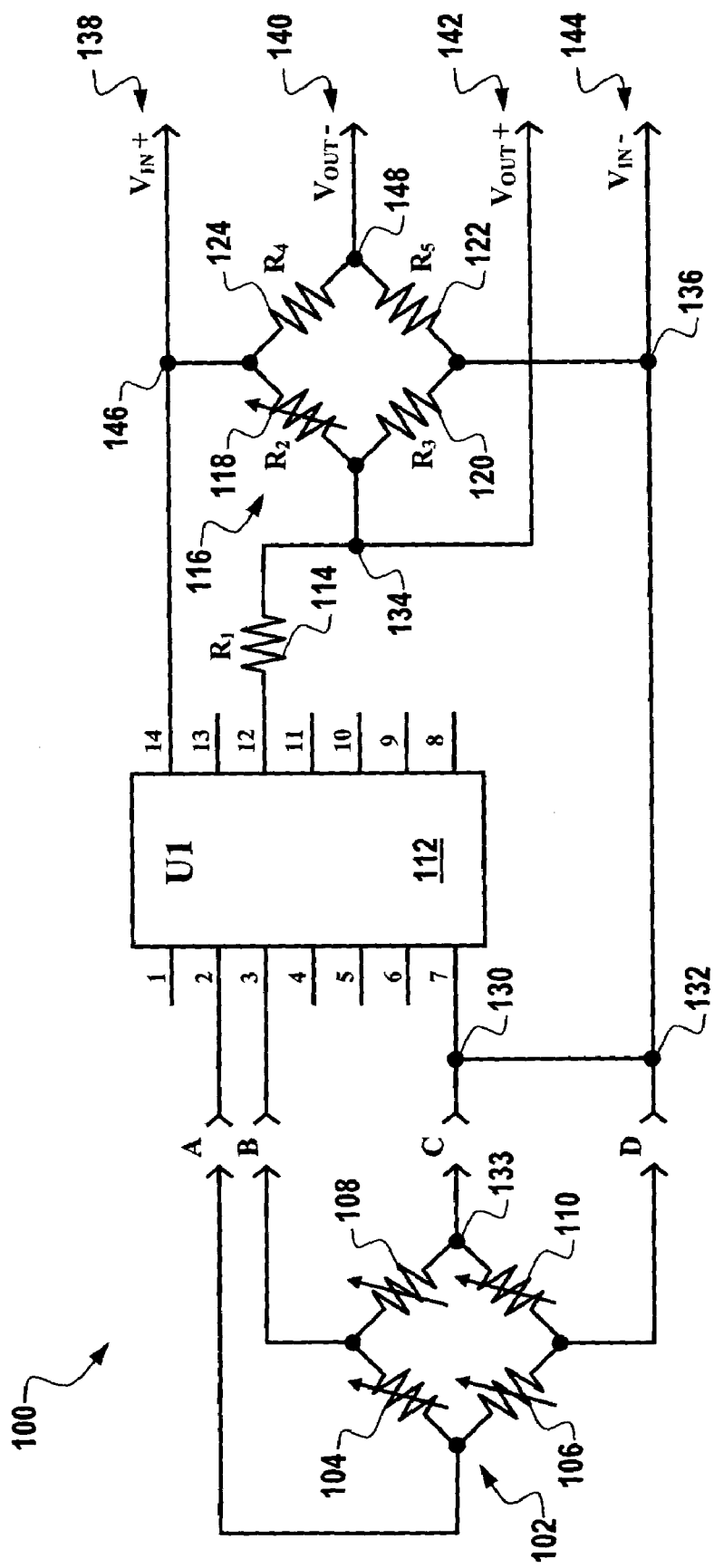
FIG. 1 illustrates a schematic diagram of a circuit, which can be implemented in accordance with a preferred embodiment.

FIG. 1 illustrates a schematic diagram of a circuit 100, which can be implemented in accordance with a preferred embodiment of the present invention. Circuit 100 generally includes a plurality or group 116 of bridge resistors 118, 120, 124, 122 and one or more connecting resistors 114 coupled to the bridge resistors 118, 120, 124, 122. Thus, a first bridge resistor 118 is connected to a second bridge resistor 124, which in turn is connected to a third bridge resistor 122. A fourth bridge resistor 120 is connected to the third bridge resistor 122. The connecting resistor 114 is generally connected to first bridge resistor 118 and fourth bridge resistor 120 at a node 134.

The connecting resistor 114 is also generally connected to a programmable amplifier 112 at pin 11. Note that programmable amplifier 112 includes a plurality of pins, including pins 1–14. In the schematic diagram depicted in FIG. 1, programmable amplifier 112 is also labeled as U1. Programmable amplifier 112 is capable of producing a signal in the range of approximately 0 volts to 5 volts at plus or minus 1 miliAmp current. Additionally, a $V_{in}^+$ voltage 138 is located at node 146, and a $V_{in}^-$ voltage 144 is located at node 136. Similarly, a $V_{out}^-$ voltage 140 is located at node 148, while a $V_{out}^+$ voltage 142 is located at node 134.

A group 102 of variable bridge resistors 104, 106, 108 and 110 is also shown in FIG. 1 indicating that such resistors may or may not be connected to circuit 100 at points A, B, C, and D. For example, nodes 130 and 132 may be connected to both pin 7 of programmable amplifier 112 and node 133.

In general, circuit 100 can be added to any available programmable integrated circuit chip, and can produce an output signal that changes in a manner similar to that of a Wheatstone bridge sensor circuit allowing inexpensive programmable IC's to be utilized in place of individually adjusted resistors. For example, such a signal can be in a range of plus or minus 100 milivolts or less at a common-mode voltage of approximately 2.5 volts, depending upon design considerations.

Figure 2:
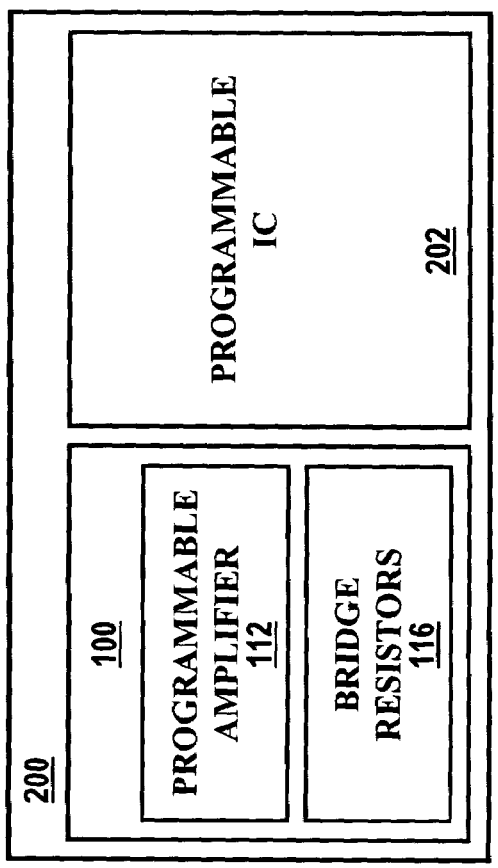
FIG. 2 illustrates a high-level block diagram of a system, which can be implemented in accordance with a preferred embodiment.

FIG. 2 illustrates a high-level block diagram of a system 200, which can be implemented in accordance with a preferred embodiment of the present invention. Note that in FIGS. 1–2, identical or similar parts are indicated by identical reference numerals. System 200 generally includes a circuit 100 that includes a programmable amplifier 112 that communicates with the group 116 of bridge resistors depicted in FIG. 1. Additionally, a programmable IC 202 is coupled to circuit 100. Note that the output signal produced by the circuit can be a signal in a range, for example, of approximately 0 to 100 mV at approximately 2.5 volts.

Figure 3:
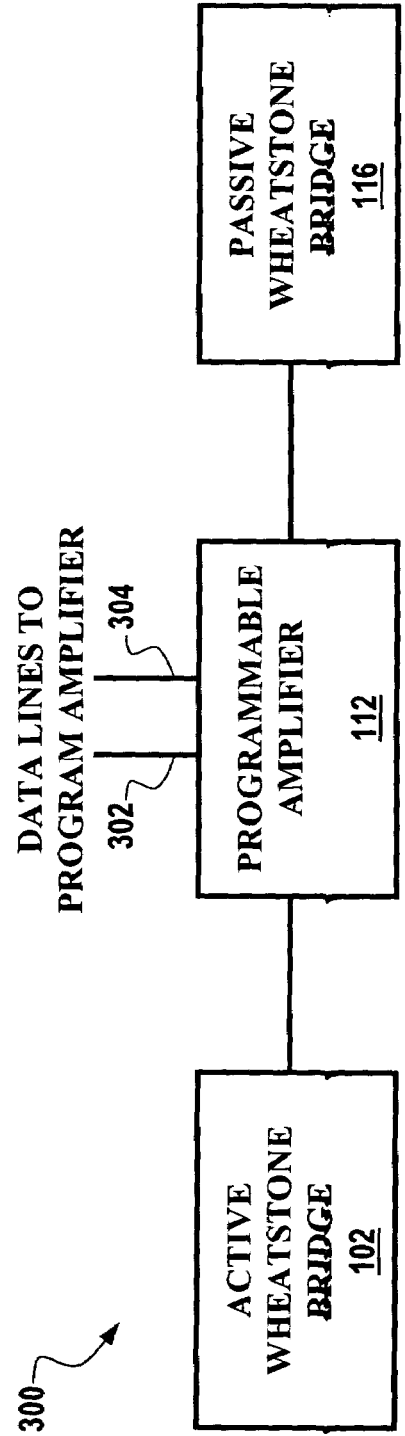
FIG. 3 illustrates a high-level block diagram of a system, which can be implemented in accordance with an alternative embodiment.

FIG. 3 illustrates a high-level block diagram of a system 300, which can be implemented in accordance with an alternative embodiment. Note that in FIGS. 1–3, identical or similar parts or components are generally indicated by identical reference numerals. Thus, system 300 includes an active Wheatstone bridge 102, which is electrically connected to a programmable amplifier 112. A passive Wheatstone bridge 116 is also electrically connected to programmable amplifier 112. One or more data lines 302 and 304 can be connected to programmable amplifier 112. Thus, active Wheatstone bridge 102 is composed of the variable resistors 104, 106, 108, 110 depicted in FIG. 1. Passive Wheatstone bridge 116 is composed of resistors 118, 120, 124, and 122 also depicted in FIG. 1.

The embodiments and examples set forth herein are presented to best explain the present invention and its practical application and to thereby enable those skilled in the art to make and utilize the invention. Those skilled in the art, however, will recognize that the foregoing description and examples have been present for the purpose of illustration and example only. Other variations and modifications of the present invention will be apparent to those of skill in the art, and it is the intent of the appended claims that such variations and modifications be covered.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The embodiments in which an exclusive property or right is claimed are defined as follows. Having thus described the embodiments, what is claimed is:

1. An output sensor apparatus, comprising:
   a circuit comprising a plurality of bridge resistors and at least one connecting resistor coupled to said plurality of bridge resistors, wherein said plurality of bridge resistors comprises at least one variable resistor;
   a programmable amplifier coupled to said at least one connecting resistor, wherein said circuit produces an output signal that changes in a manner similar to that of an output of a Wheatstone bridge circuit sensor; and
   a programmable integrated circuit (IC), which is connectable to said circuit and said programmable amplifier.

2. The apparatus of claim 1 wherein said plurality of bridge resistors comprises a passive Wheatstone bridge circuit electrically connected to said program amplifier.

3. The apparatus of claim 1 wherein said plurality of bridge resistors further comprises an active Wheatstone bridge circuit electrically connected to said programmable amplifier.

4. The apparatus of claim 1 wherein said plurality of bridge resistors comprises four bridge resistors, including a first resistor coupled to a second resistor, a third resistor connected to said second resistor and a fourth resistor connected to said third resistor and said first resistor.

5. The apparatus of claim 4 wherein said at least one connecting resistor is connected to said first resistor and said fourth resistor of said plurality of bridge resistors.

6. The apparatus of claim 1 wherein said plurality of bridge resistors comprises an active Wheatstone bridge circuit electrically connect to said programmable amplifier and a passive Wheatstone bridge circuit electrically connected to said programmable amplifier.

7. The apparatus of claim 6 further comprising a sensor comprising said circuit and said programmable amplifier.

8. An output sensor system, comprising:
   a circuit comprising a plurality of bridge resistors comprising at least one variable resistor and at least one connecting resistor coupled to said plurality of bridge resistors, wherein said plurality of bridge resistors comprises four bridge resistors, including a first resistor coupled to a second resistor, a third resistor connected to said second resistor and a fourth resistor connected to said third resistor and said first resistor and wherein said at least one connecting resistor is connected to said first resistor and said fourth resistor of said plurality of bridge resistors;
   a programmable amplifier coupled to said at least one connecting resistor, wherein said circuit produces an output signal that changes in a manner similar to that of an output of a Wheatstone bridge circuit sensor; and
   a programmable integrated circuit (IC), which is connectable to said circuit and said programmable amplifier.

9. The system of claim 8 wherein said plurality of bridge resistors comprises a passive Wheatstone bridge circuit electrically connected to said programmable amplifier.

10. The system of claim 8 wherein said plurality of bridge resistors comprises a passive Wheatstone bridge circuit electrically connected to said programmable amplifier and an active Wheatstone bridge electrically connected to said programmable amplifier.

11. The system of claim 8 wherein said plurality of bridge resistors comprises an active Wheatstone bridge circuit electrically connected to said programmable amplifier.

12. An output sensor method, comprising the steps of:
providing a circuit comprising a plurality of bridge resistors and at least one connecting resistor coupled to said plurality of bridge resistors, wherein at least one bridge resistor among said plurality of bridge resistors comprises a variable resistor;
connecting a programmable amplifier to said at least one connecting resistor;
connecting a programmable integrated circuit (IC) to said programmable amplifier; and
generating an output signal from said circuit that changes in a manner similar to that of an output of a Wheatstone bridge circuit sensor.

13. The method of claim 12 further comprising the step of configuring said plurality of bridge resistors as an active Wheatstone bridge circuit and a passive Wheatstone bride circuit electrically connected to said programmable amplifier.

14. The method of claim 13 further comprising the steps of:
configuring said plurality of bridge resistors to comprise four bridge resistors, including a first resistor coupled to a second resistor, a third resistor connected to said second resistor and a fourth resistor connected to said third resistor and said first resistor; and
connecting said at least one connecting resistor to said first resistor and said fourth resistor of said plurality of bridge resistors.

15. The method of claim 13 further comprising configuring said plurality of bridge resistors to comprise an active Wheatstone bridge circuit.

16. The method of claim 13 further comprising configuring said plurality of bridge resistors to comprise a passive Wheatstone bridge circuit.

\* \* \* \* \*

UNITED STATES PATENT AND TRADEMARK OFFICE
CERTIFICATE OF CORRECTION

| | | |
|---|---|---|
| PATENT NO. | : 7,064,558 B1 | Page 1 of 1 |
| APPLICATION NO. | : 11/015924 | |
| DATED | : June 20, 2006 | |
| INVENTOR(S) | : Ian N. Bentley | |

It is certified that error appears in the above-identified patent and that said Letters Patent is hereby corrected as shown below:

Column 4, line 42, delete "connect" and add --connected--;
Column 6, line 1, delete "bride" and add --bridge--.

Signed and Sealed this

Twenty-sixth Day of December, 2006

JON W. DUDAS
*Director of the United States Patent and Trademark Office*